US005404268A

United States Patent [19]
O'Connor

[11] Patent Number: 5,404,268
[45] Date of Patent: Apr. 4, 1995

[54] INTERFACE ALLOWING NORMAL OR INVERTED INSERTION OF DATA COMMUNICATIONS CARD

[75] Inventor: Clint H. O'Connor, Austin, Tex.

[73] Assignee: Dell USA, L.P., Austin, Tex.

[21] Appl. No.: 91,806

[22] Filed: Jul. 15, 1993

[51] Int. Cl.$^6$ ............... H05K 7/10; H01R 27/00
[52] U.S. Cl. ............... 361/683; 439/217; 235/441
[58] Field of Search ............... 439/677, 680, 217, 280, 439/638, 654, 655; 364/708.1; 361/683–686, 737; 235/441, 477, 480

[56] References Cited

U.S. PATENT DOCUMENTS 5,036,430 7/1991 Hills .................... 361/684 X
5,289,339 2/1994 Akashi et al. ............... 361/684

FOREIGN PATENT DOCUMENTS 2214680 9/1989 United Kingdom ............... 235/441

*Primary Examiner*—Michael W. Phillips
*Attorney, Agent, or Firm*—David L. McCombs; James W. Huffman

[57] ABSTRACT

An interface for providing an electrical and mechanical connection of a data processing unit to a data communications card. The connections have a plurality of sockets in a predetermined alignment. Contained within the unit is a series of connectors in an alignment corresponding to the predetermined alignment of the sockets so that when the sockets and the connectors respectively engage, predetermined electrical circuits are completed. An actuator is also disposed within the housing for generating an output signal indicative of the orientation of either the sockets or the connectors. A multiplexer circuit is provided to reverse either the sockets or the connectors, when necessary, in response to the output of the actuator.

16 Claims, 4 Drawing Sheets

| MICROSWITCH STATE | LOGICAL OUTPUT |
|---|---|
| 0 | PHYSICAL PIN 1 |
| 1 | PHYSICAL PIN 68 |

INTERFACE ALLOWING NORMAL OR INVERTED INSERTION OF DATA COMMUNICATIONS CARD

TECHNICAL FIELD

The present invention relates to the field of portable data processing units, such as notebook and laptop computers. More particularly, it relates to an interface between a computer communications card and a portable data processing unit, and specifically to a device that allows the card to be invertedly inserted in the unit.

BACKGROUND OF THE INVENTION

Spatial restrictions inside the housing of a portable data processing unit have resulted in the establishment of relative small spatial dimension standards for data access devices for use with a portable unit. As a result, what is generally referred to as a "computer communications card" has evolved for connecting the computer to various data communications interfaces for transmitting multiple transmission protocols. For example, one set of standards for these type cards has been developed by the Personal Computer Memory Card International Association "PCMCIA"). This type of memory card is often referred to as a "PCMCIA" card and is in the form of a wafer approximately the size of a credit card.

The relative small size of the communications card does not allow for connections to any conventional interfaces such as telephone jacks, battery holders, Local Area Network (LAN) jacks, and other such devices. As a result, many communications cards utilize cables with thin connectors that are plugged into the card on one end with conventional interfaces at the other end. In many cases, the cable creates problems, such as, for example, a limited data transfer rate. Therefore, some manufacturers have designed bulges or enclosures at the end of the communications card and extending from one surface thereof which can provide the additional space required for the conventional interfaces without the problematic cable. The bulges and enclosures, however, create another problem in connection with units that utilize two closely spaced sockets that will accept one card each. More particularly, the problem occurs when the lower socket is used to accommodate a card with a bulge or enclosure attachment since, once the card is completely engaged, the bulge or enclosure blocks a portion of the upper socket rendering it useless. One way to solve this problem is to invert the card and insert it in the lower socket so that the bulge or enclosure will extend downwardly and not upwardly blocking the upper socket. However, communications cards and sockets are designed to make inverted insertion impossible.

Therefore, an interface is needed to permit the card to be invertedly inserted to allow use of both sockets regardless of the bulges or enclosures at the end of the cards.

SUMMARY OF THE INVENTION

It is therefore an object of the present invention to provide an electrical assembly having a first series of connectors that is connected to a second series of connectors regardless of whether or not the connectors are in or out of alignment.

It is a further object of the present invention to provide an interface between a portable data processing unit and a communications card that receives the card regardless of whether the card is inserted properly or inverted.

It is a further object of the present invention to provide an interface of the above type in which a microswitch detects the orientation of the inserted card.

It is a further object of the present invention to provide an interface of the above type in which a multiplexer is located external to the interface chip or incorporated into the chip design to reverse the internal data designations of the portable data processing unit to allow for the inverted insertion of the communications card in the interface.

Towards the fulfillment of these and other objects, the interface of the present invention includes an actuator for sensing the orientation of a communications card inserted into a data processing unit. The actuator, which is attached to either the card or the unit, signals a microswitch to cause a multiplexer to reverse the orientation of the receiving device when the orientation of the card requires such a reversal.

DESCRIPTION OF THE PRIOR ART

Figure 1:
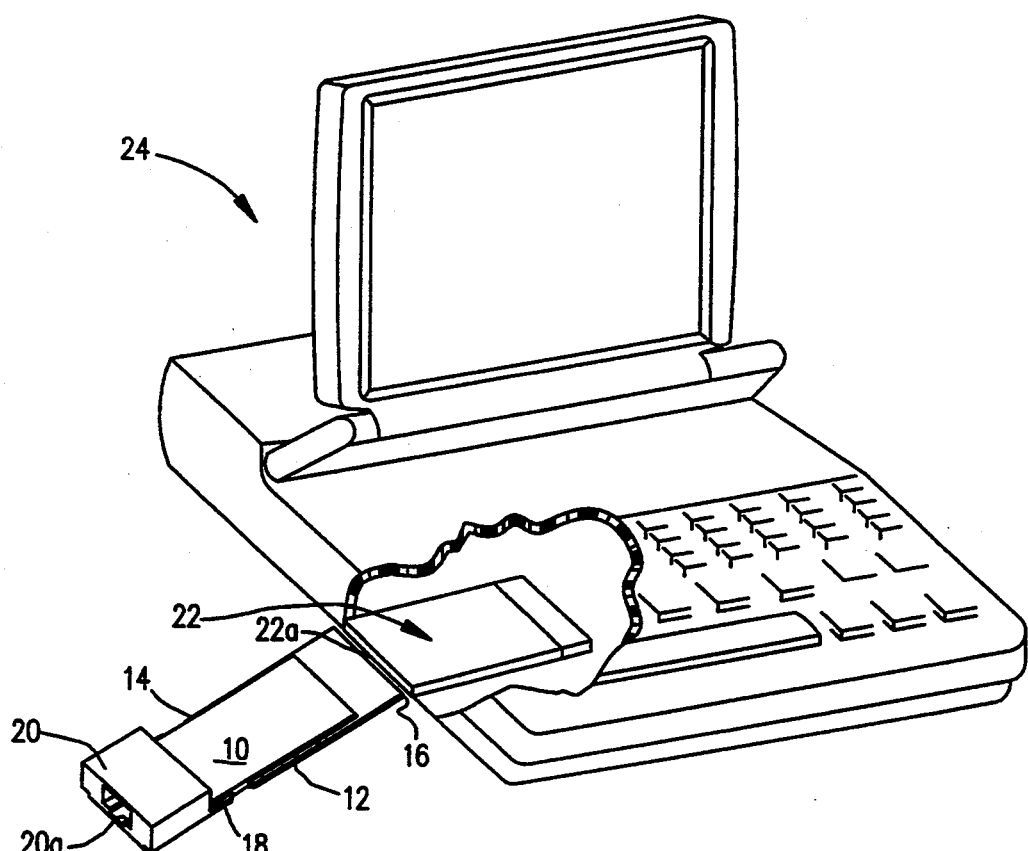
FIG. 1 is a partially cut away, exploded, perspective view of a prior art communications card and a computer housing designed to receive it.

Referring specifically to the drawings, FIG. 1 illustrates a communications card referred to in general by reference numeral 10, which, for purposes of example, is in the form of a PCMCIA card. The communications card 10 has two sides 12 and 14, a rear end 16, and a front end 18. Integrally attached to the front 18 of the card 10 is a connector 20, commonly referred to as a bulge, for permitting the attachment of conventional interfaces, such as a telephone jack 20a, to the card 10. Also shown is a connector block, or housing, 22 which defines a socket 22a for receiving the card 10. The connector housing 22 is located inside of a portable data processing unit 24, such as a notebook or laptop computer. The communications card 10 is inserted into the socket 22a to supply memory or otherwise enhance the data processing unit's operation.

Figure 2:
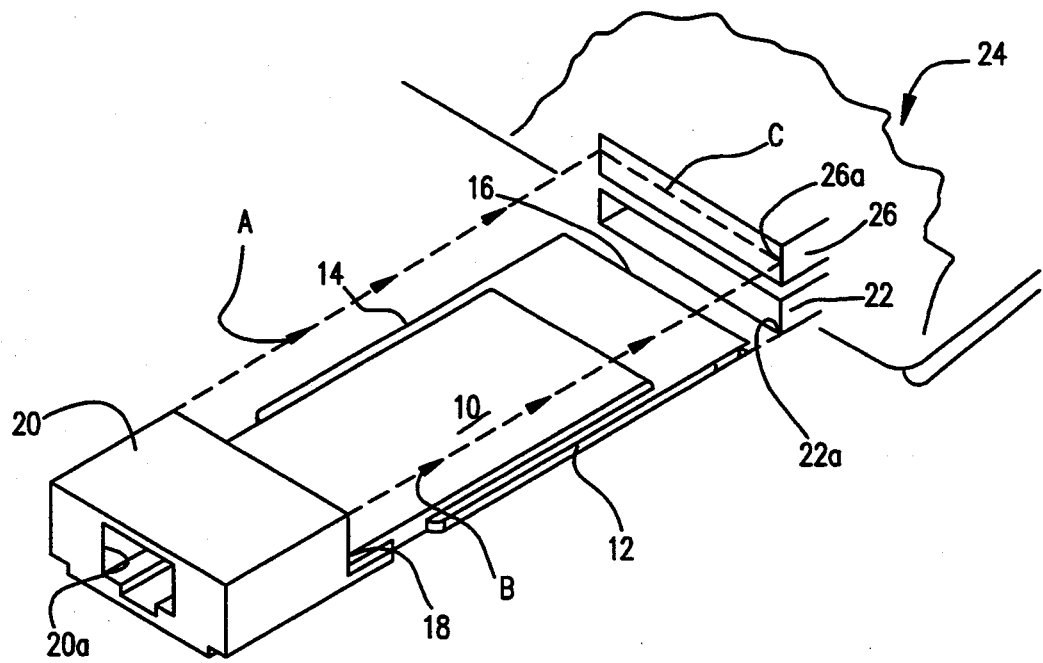
FIG. 2 is an enlarged partially cut away, exploded, perspective view of the card of FIG. 1 and two vertically spaced interfaces defining sockets to receive two communications cards.

FIG. 2 depicts the connector housing 22 of FIG. 1 with an additional connector housing 26 extending over the connector housing 22 in a closely spaced relationship. Connector housing 26 defines a second socket 26a for receiving a second communications card (not shown).

Dashed lines A and B indicate the path the communications card 10 will take when it is inserted into the socket 22a. Due to the close proximity of the housings 22 and 26, the connector 20 blocks the socket 26a along the dashed line C when the card 10 is fully inserted into the socket 22a, precluding the socket 26a from receiving a second communications card (not shown).

Figure 3:
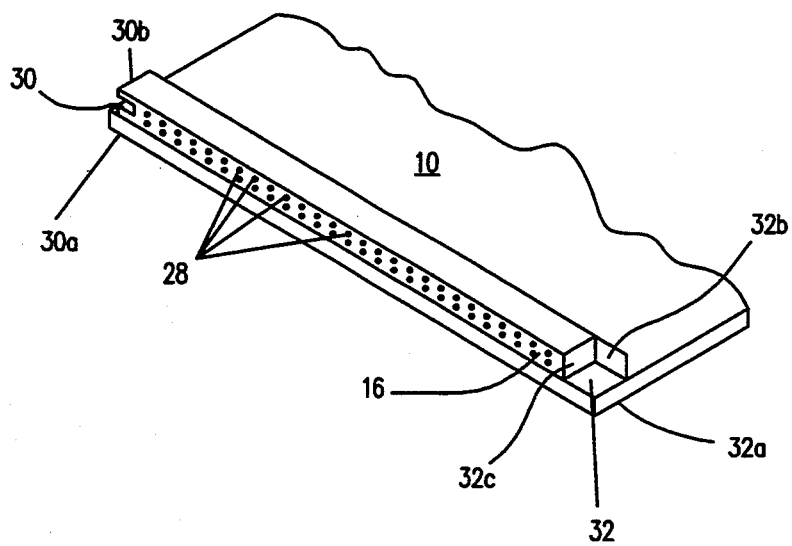
FIG. 3 is a partial rear perspective view of the card of FIGS. 1 and 2.

Referring to FIG. 3, the rear end 16 of the card 10 of FIG. 1 is shown depicting a plurality of pin sockets 28 for establishing electrical communications with the circuitry of the data processing unit 24. Each of the pin sockets 28 is adapted to receive a corresponding pin of the connector housing 22, as will be described, to communicate a particular set of information to and from the data processing unit 24. Specific mechanisms are designed into both the communications card 10 and the connector housings 22 and 26 to prevent improper insertion of the card 10. Specifically, on the communication card 10, a groove 30 and a chamber 32 are provided on opposite sides of the rear end 16 to insure that the card 10 is inserted properly, as will be described later. The groove 30 is defined by lower leg 30a and an upper leg 30b. The chamber 32 is defined by a lower plate 32a, a rear wall 32b, and a side wall 32c.

Figure 4:
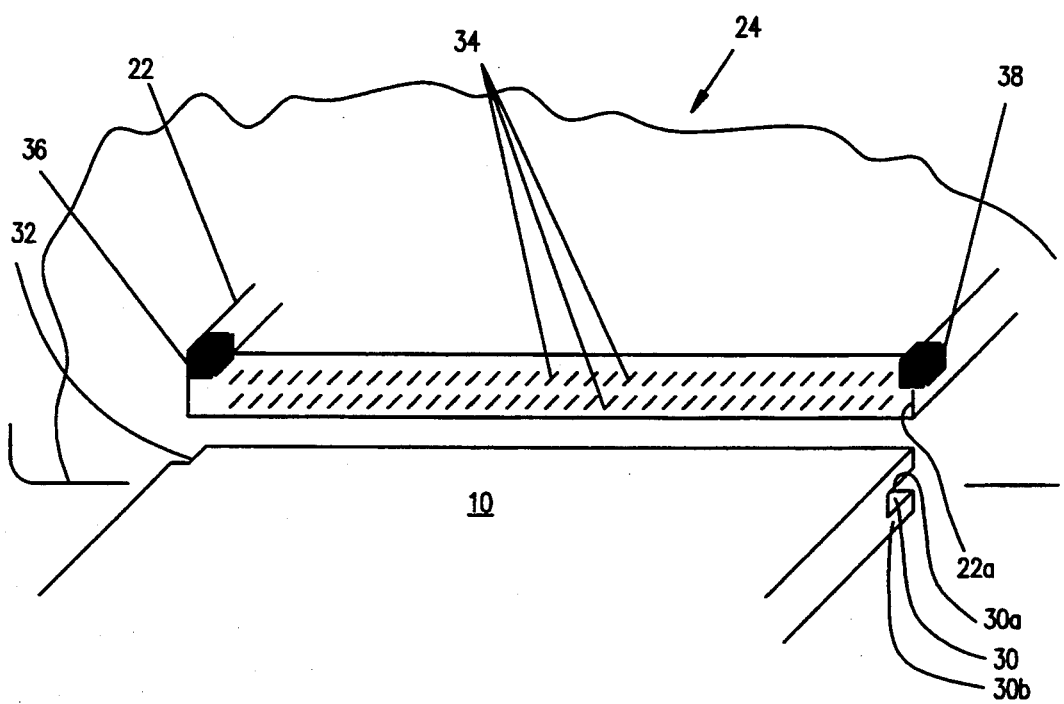
FIG. 4 is an exploded view of a portion of the card of FIGS. 1-3 and an interface designed to receive the card.

FIG. 4 is a depiction of the lower housing 22 of FIGS. 1 and 2 including the socket 22a which contains a plurality of pins 34. The socket 22a also has a left locating post 36 and a right centrally positioned locating post 38, to prevent the improper insertion of the communications card 10 into the housing 22.

According to the prior art arrangement of FIGS. 1-4, when the communications card 10 is inserted properly into the lower socket 22a the locating posts 38 and 36 will receive the groove 30 and the chamber 32, respectively, and the pin sockets 28 will engage the corresponding pins 34 to electrically connect the card to the data processing unit 24. However, as illustrated by dashed line C of FIG. 2, the upper socket 26a will be blocked by the connector 20 and rendered useless for the insertion of a second communications card (not shown).

The user may attempt to invert and insert the communications card 10 to free the upper socket 26a for insertion of a second card. However, if this is attempted, the lower leg 30b would impact the left locating post 36 which prevents the engagement of the pin sockets 28 with the pins 34, it being understood that the misalignment of the pin sockets 28 with the pins 34 can result in data processing unit malfunction, data corruption, or system failure.

DESCRIPTION OF THE PREFERRED EMBODIMENTS

Figure 5:
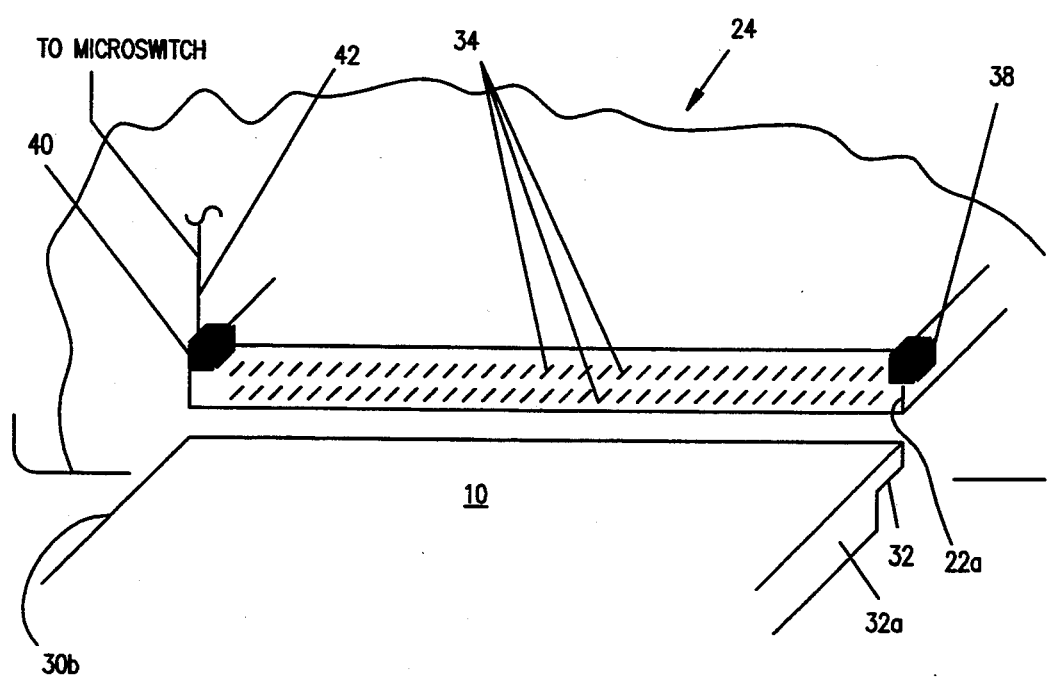
FIG. 5 is an exploded view of the interface of the present invention and a data communications card.
Figures 6, 7:
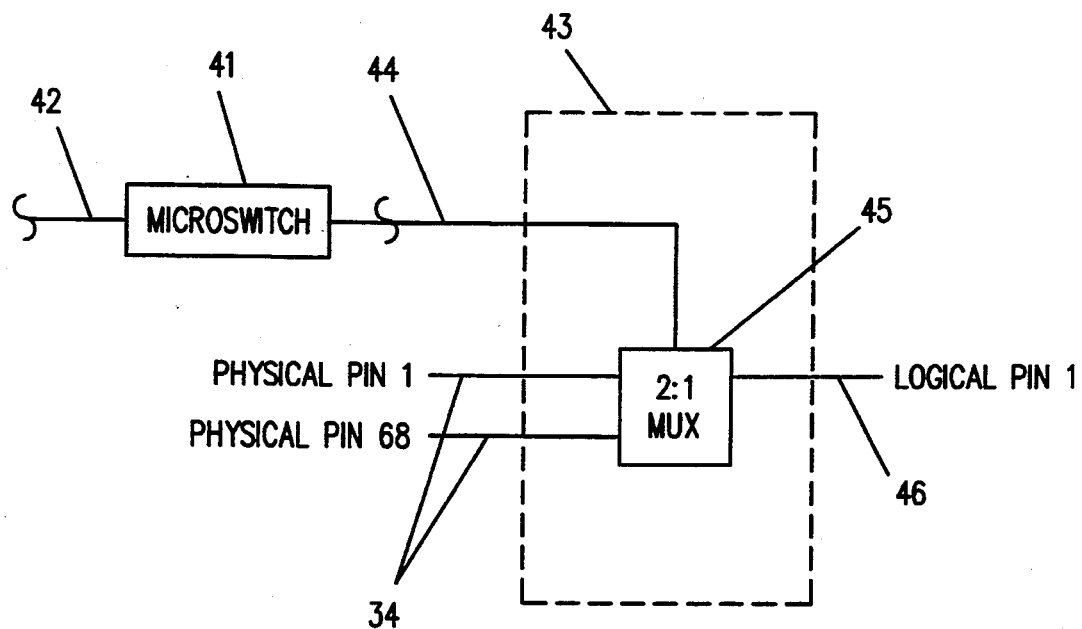
FIG. 6 is a block diagram for the interface of the present invention.
FIG. 7 is a state table for the interface of the present invention.

The interface of the present invention is shown in FIGS. 5 and 6 and includes some components of the above-mentioned prior art interface which are given the same reference numbers. According to the present invention, the locating post 36 (FIG. 4) is replaced by an actuator, which may take the form of a plunger 40 that forms a portion of a microswitch 41, so that when card 10 is invertedly inserted into the socket 22a, the plunger 40 is engaged to actuate the microswitch 41 in a manner to be described.

The plurality of pins 34 within the socket 22a are, by convention, sequentially numbered with the first pin being the uppermost pin on the left and the last pin being the lowermost pin on the right. In the illustrated embodiment the interface comprises 68 pins, so that the first pin will be designated as pin 1 and the last pin will be designated as pin 68.

As previously indicated, when the card 10 is invertedly inserted into the socket 22a, the plunger 40 is engaged to actuate the microswitch 41. A line 42 connects the plunger 40 to the microswitch to effect actuation. The microswitch 41 generates a signal indicative of the state of the microswitch 41 to an electrical circuit 43. The circuit 43 operates to reverse the conventional designations assigned to the pins 34, such that physical pins 1, 2, 3, etc. are regarded by the data processing unit 24 as pins 68, 67, 66, etc., respectively, when the microswitch is actuated. As a result, the card 10 may be invertedly inserted into the socket 22a without causing data function or system error normally associated with inverted insertion.

The microswitch 41 is connected, via a line 44, to select an input of each of a plurality of 2:1 multiplexers, only one of which is shown and designated by the reference numeral 45. The multiplexer (MUX) 45 is configured to reverse the designations of physical pins 1 and 68, it being understood that the additional multiplexers, configured in a manner similar to that hereinafter discussed with reference to the MUX 45, are connected to reverse the designations of the remaining pins 34. The inputs of the MUX 45 are connected to the pins 1 and 68, respectively, for receiving signals therefrom. As will be described, the state of the signal generated by the microswitch 41 on the line 44 is used to select an input signal to be output the MUX 45 on a line 46, which line 46 is connected as if it were actually physical pin 1.

FIG. 7 illustrates a state table of the MUX 45. As shown in the table, when the signal produced by the microswitch 41 is zero (0), as is the case when the card 10 is not invertedly inserted into the socket 22a and the microswitch 41 is not actuated, the input connected to physical pin 1 will be selected and the signal thereon will be output on line 46, as would normally be the case. However, if the signal produced by the microswitch 41 is a one (1), as would be the case when the card 10 is invertedly inserted into the socket 22a, thereby actuating the microswitch 41, the input connected to physical pin 68 will be selected and the signal thereon will be output on line 46.

As previously indicated, it should be understood that each of the plurality of MUXes comprising the circuit 43 will be used to select between and properly route signals on two corresponding pins (e.g., 1 and 68, 2 and 67, . . . 67 and 2, 68 and 1 ). When the state of the microswitch 41 is 0 (i.e., the microswitch 41 is not actuated), the logical designations of the pins 34 will remain unaffected. When the state of the microswitch 41 is 1 (i.e., the microswitch 41 is actuated), the logical designations of the pins 34 will be reversed by the plurality of multiplexers.

In operation, when the communications card 10 is properly inserted in the housing 22, the actuator plunger 40 will extend between the legs 30a and 30b (FIG. 4) and the microswitch 41 will not be actuated. If the card is invertedly inserted, as shown in FIG. 5, the lower leg 30b of the communications card 10 will engage and retract the actuator plunger 40 to actuate the microswitch 41.

Several variations may be made in the foregoing without departing from the scope of the invention. For example, the actuator 40 is not limited to the plunger described above but can take other forms. For example, an electronic sensor can be used so that the multiplexer receives a signal to reverse the pin designations when the card 10 is invertedly inserted. In addition, the polarity of the microswitch and the structure of the state table may be reversed, yet still accomplish the same function. Also, the microswitch may be located on the opposite side of the card 10 so that it is typically activated, but fails to activate if the card is invertedly inserted. Moreover, the interface may apply to other devices such as, between a computer monitor and the computer or between a printer and the computer.

This invention can be applied to either the card design or the computer socket design and can be applied to any type of connectors in which a plurality of pins engage a plurality of sockets in a predetermined alignment. Accordingly, it is appropriate that the appended claims be construed broadly and in a manner consistent with the scope of the invention.

What is claimed is:

1. An electrical assembly comprising a first component having a first series of connectors in a predetermined alignment; a second component having a second series of connectors in an alignment corresponding to said predetermined alignment of said first series of connectors so that when said first and second series of connectors respectively engage, predetermined electrical circuits are completed; means associated with one of said components and responsive to one of said series of connectors being rotated 180° out of said alignment with respect to a plane which allows said connectors to continue facing each other for generating an output signal; and means responsive to the generation of said output signal for electrically establishing said predetermined alignment.

2. The electrical assembly of claim 1 wherein said first component comprises a computer communications card for transmitting electrical signals between said card and said second component.

3. The electrical assembly of claim 1 wherein said second component comprises a data processing unit.

4. The electrical assembly of claim 1 wherein said means responsive to one of said series of connectors being rotated 180° out of said alignment comprises an actuator disposed in said second component.

5. The electrical assembly of claim 1 wherein said means responsive to the generation of said output signal comprises a multiplexer circuit for establishing said predetermined alignment.

6. An interface for providing an electrical and mechanical connection to an electrical component having a first series of connectors in a predetermined alignment, said interface comprising a housing; a second series of connectors disposed in said housing in an alignment corresponding to the predetermined alignment of the first series of connectors so that when said first and second series of connectors respectively engage, predetermined electrical circuits are completed; means disposed in said housing and responsive to one of said series of connectors being rotated 180° out of said alignment with respect to a plane which allows said connectors to continue facing each other for generating an output signal; and means responsive to the generation of said output signal for electrically establishing said predetermined alignment.

7. The interface of claim 6 wherein said second series of connectors comprises a plurality of sockets for receiving the first series of connectors.

8. The interface or claim 6 wherein said interface is contained within a computer.

9. The interface or claim 6 wherein said output generating means is disposed in said second series of connectors.

10. The interface of claim 6 wherein said output generating means is disposed in said housing within said interface.

11. The interface of claim 6 wherein said means responsive to one of said series of connectors being rotated 180° out of said alignment comprise an actuator for causing said output signal to be generated.

12. The interface of claim 11 wherein said means responsive to said output signal comprises a multiplexer circuit for establishing said predetermined alignment.

13. An electrical assembly comprising:
   a first component having a first series of connectors in a predetermined alignment;
   a second component having a second series of connectors in an alignment corresponding to said predetermined alignment of said first series of connectors so that when said first and second series of connectors respectively engage, predetermined electrical circuits are completed;
   a microswitch associated with one of said components and responsive to one of said series of connectors being rotated 180° out of said alignment alignment with respect to a plane which allows said connectors to continue facing each other for generating an output signal; and
   a circuit responsive to the generation of said output signal for electrically establishing said predetermined alignment.

14. The electrical assembly of claim 13 wherein said first component comprises a computer communications card for transmitting electrical signals between said card and said second component.

15. The electrical assembly of claim 14 wherein said second component comprises a data processing unit.

16. The electrical assembly of claim 13 wherein said circuit responsive to the generation of said output signal comprises at least one multiplexer for establishing said predetermined alignment.

* * * * *